(12) United States Patent
Yang

(10) Patent No.: US 12,184,018 B2
(45) Date of Patent: Dec. 31, 2024

(54) TYPE-C AND USB TWO-IN-ONE INTERFACE WIRELESS RADIO FREQUENCY RECEIVER

(71) Applicant: Renping Yang, Huizhou (CN)

(72) Inventor: Renping Yang, Huizhou (CN)

( * ) Notice: Subject to any disclaimer, the term of this patent is extended or adjusted under 35 U.S.C. 154(b) by 482 days.

(21) Appl. No.: 17/596,578

(22) PCT Filed: Dec. 13, 2019

(86) PCT No.: PCT/CN2019/125329
§ 371 (c)(1),
(2) Date: Dec. 14, 2021

(87) PCT Pub. No.: WO2021/017371
PCT Pub. Date: Feb. 4, 2021

(65) Prior Publication Data
US 2022/0302662 A1 Sep. 22, 2022

(30) Foreign Application Priority Data

Jul. 29, 2019 (CN) .......................... 201910689117.8
Jul. 29, 2019 (CN) .......................... 201921203375.2

(51) Int. Cl.
*H01R 13/62* (2006.01)
*H01R 13/502* (2006.01)
(Continued)

(52) U.S. Cl.
CPC ........... *H01R 31/00* (2013.01); *H01R 13/502* (2013.01); *H01R 13/6205* (2013.01);
(Continued)

(58) Field of Classification Search
None
See application file for complete search history.

(56) References Cited

U.S. PATENT DOCUMENTS 9,004,951 B2 * 4/2015 Wu ........................ H01R 27/00
439/638
10,483,704 B1 * 11/2019 Solland .................. H01R 29/00
(Continued)

FOREIGN PATENT DOCUMENTS

CN 205721889 B1 11/2016
CN 205721889 U 11/2016
(Continued)

*Primary Examiner* — Michael C Zarroli
(74) *Attorney, Agent, or Firm* — Jeenam Park

(57) ABSTRACT

A type-c and USB two-in-one interface wireless radio frequency receiver, including a USB interface, a USB portion, a Type-c portion, an upper cover, a lower cover, a handle, and a connecting magnet. The USB portion is connected to the Type-c portion and placed on the lower cover. The USB interface and the type-c interface are fixed in the same storage device, but they are only physically fixed together, and the internal data is stored separately and is not mixed. When exporting data, the corresponding USB or type-c interface will be used, so that no matter which interface is used, this two-in-one receiver will meet the needs. A handle with a rotary design is further provided to protect the Type-c portion from damage. The upper side of the handle is fixed to a fixing rope via the fixing hole, so as to tie the device and facilitate to carry it around.

5 Claims, 5 Drawing Sheets

(51) Int. Cl.
     *H01R 27/00*           (2006.01)
     *H01R 31/00*           (2006.01)
     *H01R 31/06*           (2006.01)
     *G02B 27/20*           (2006.01)
     *H01R 13/66*           (2006.01)
(52) U.S. Cl.
     CPC ............ *G02B 27/20* (2013.01); *H01R 13/665* (2013.01); *H01R 27/00* (2013.01); *H01R 31/06* (2013.01)

(56)           References Cited

U.S. PATENT DOCUMENTS

2014/0170909 A1*   6/2014   Liao ................ H01R 31/06
                                                            439/730
2014/0273581 A1*   9/2014   McSweyn .......... H01R 13/639
                                                            439/300
2014/0273613 A1    9/2014   McSweyn et al.

FOREIGN PATENT DOCUMENTS

| | | |
|---|---|---|
| CN | 206993169 U | 2/2018 |
| CN | 207691166 B1 | 8/2018 |
| CN | 206993169 B1 | 9/2018 |
| CN | 110380264 A | 10/2019 |
| CN | 110380264 B1 | 10/2019 |
| CN | 208368821 B1 | 11/2019 |

\* cited by examiner

TYPE-C AND USB TWO-IN-ONE INTERFACE WIRELESS RADIO FREQUENCY RECEIVER

TECHNICAL FIELD

The present disclosure relates to a receiver, and more particularly relates to a type-c and USB two-in-one interface wireless radio frequency receiver.

BACKGROUND

A radio frequency receiver currently is mainly used for applications including a laser page turning pen and a wireless mouse, where the primary port is USB. With the application of the type-c interface, many scenarios require the type-c interface. If you want to use two interfaces with devices available from the existing market, you need two receivers. Currently, there is only one interface for radio frequency receivers on the market, either USB or Type-c, which is not convenient for users. When used in different situations, it is needed to prepare two storage devices: USB interface and Type-c interface, making it inconvenient to use and carry, and easy to lose during use, affecting the use of data in the storage device.

SUMMARY

In view of the above technical problems, the present disclosure provides a type-c and USB two-in-one interface radio frequency receiver, including a USB interface, a type-c interface, a processing chip, an upper cover, a lower cover, a handle, a connecting magnet. The processing chip is divided into a type-c portion and a USB portion. The type-c portion is connected to the type-c interface. The type-c interface is placed on the lower cover. The lower cover includes a buckling portion and a fixing portion, and the type-c interface is placed on the buckling portion. The upper side of the buckling portion is fixed to an upper cover, and the type-c interface passes through the fixing portion. The USB interface is fixed to the type-c interface by welding, fixing shafts are welded to both sides of the fixed portion, the fixed portion is connected to the handle by the fixing shafts, and connecting magnets are fixed to both sides of the handle.

The USB portion and the Type-c portion are fixed together by welding.

The processing chip includes a carrier, a type-c communication circuit, and a USB communication circuit. The type-c communication circuit and the USB communication circuit are each soldered on the carrier, and two ends of the carrier are respectively connected to the USB interface and the type-c interface.

The fixing shafts are movably connected to the handle.

The buckling portion is of a groove structure, where the three sides of the buckling portion form a groove structure on the upper side. The upper cover is of a groove structure. The upper three portions of the upper cover have a convex structure, and the groove structure and the convex structure are used in cooperation and are fitted together.

The handle is a rotatable structure relative to the lower cover.

A fixing hole is defined in the upper side of the handle, and a lanyard is tied in the fixing hole.

The USB is a data transmission line for connecting a computer to a device, and the type-c interface is a connection interface that can be inserted regardless of the front and back sides, such as an IPhone mobile phone interface.

The present disclosure may provide the following beneficial effects. The present disclosure fixes the USB interface and the type-c interface in the same storage device, but simply integrates the USB portion and the Type-c portion. The internal storage data is stored separately and will not be mixed with each other. When needing to export data, the corresponding USB interface or type-c interface are used, so that no matter which interface you need to use, you only need this two-in-one receiver. Moreover, the present disclosure is also provided with a handle with a rotary design, so that the rotary handle can protect the Type-c part to avoid damage. The upper side of the handle of the present disclosure is also fixed to a fixing rope by means of the fixing hole, which can tie the present disclosure and facilitate the user to put it away.

After the handle of the present disclosure is rotated and returned to its position, the present disclosure can also be inserted into a voice recorder, a laser pointer, and other equipment through the USB interface of these devices. The lanyard at the fixing hole of the present disclosure facilitates the collection of the present disclosure, and avoids the situation that the present disclosure is inconvenient to carry and is easily lost during use, which affects the use of data in the storage device.

The present disclosure is a rotatable two-in-one design, which perfectly combines the USB interface with the Type-c interface, which is integrated and multi-purpose, and has a simple and elegant appearance. The retractable magnetic storage design can perfectly hide the present disclosure in the laser pointer and other similar pen bodies, making it better to prevent loss and convenient to carry around.

Figure 1:
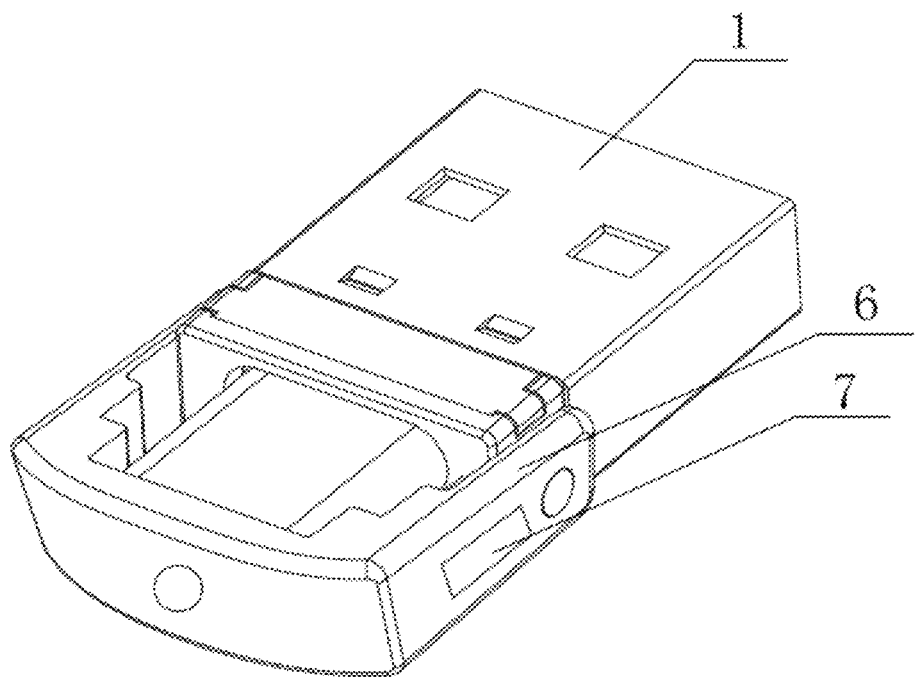
FIG. 1 is a schematic diagram of the present disclosure.
Figure 2:
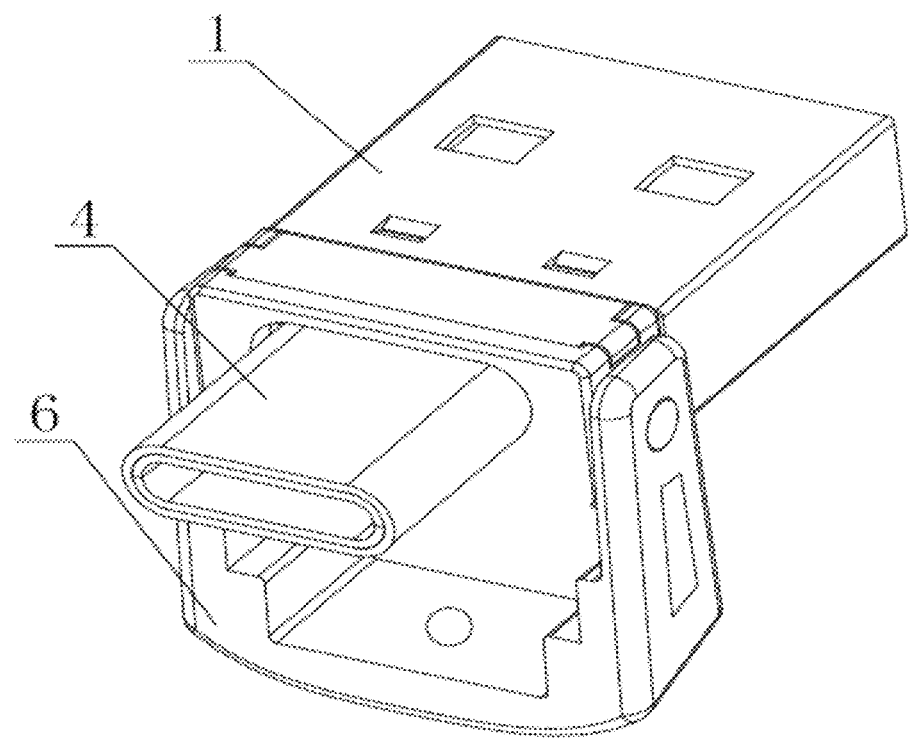
FIG. 2 is a schematic diagram of the present disclosure when the handle is rotated.
Figure 3:
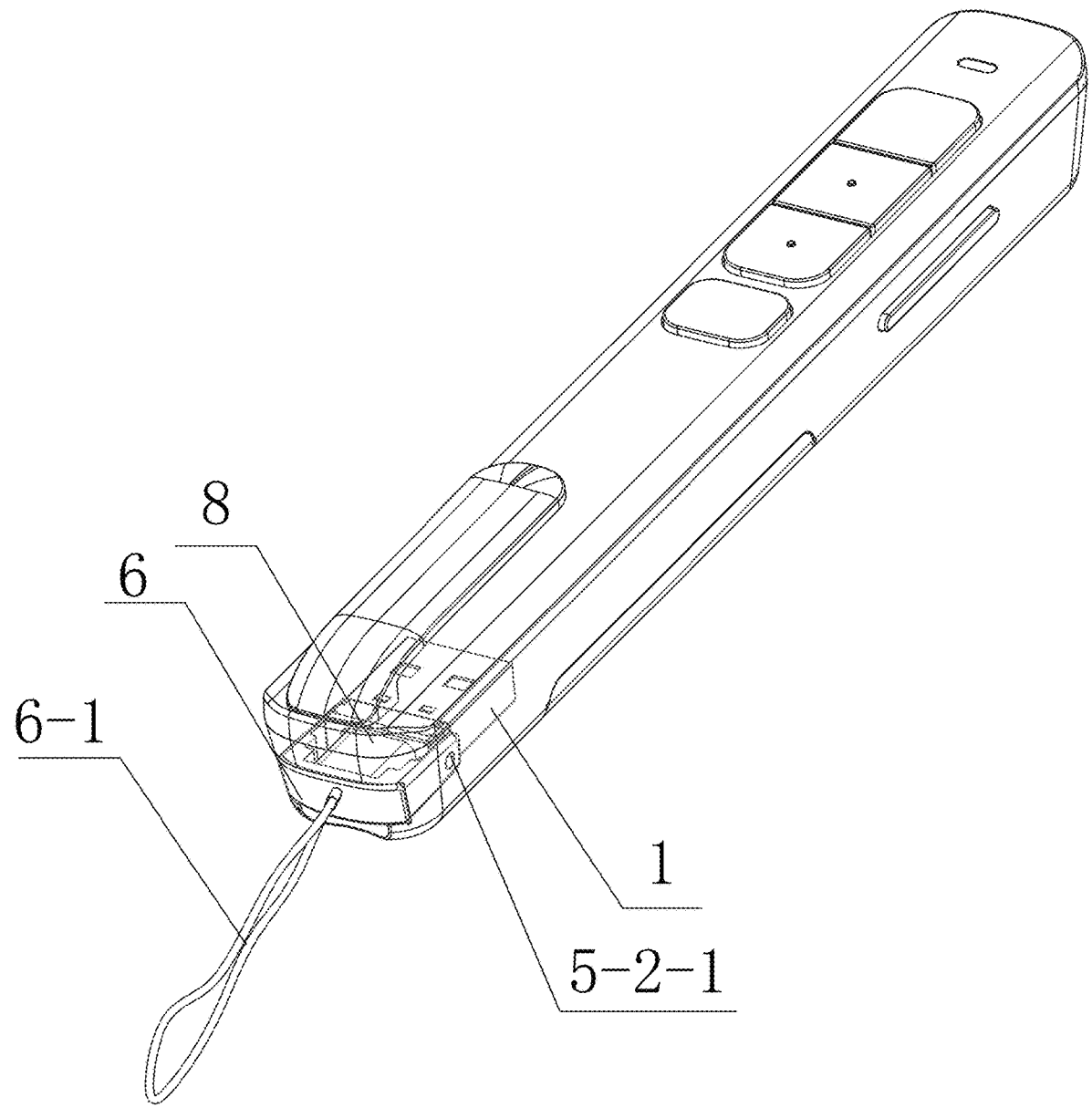
FIG. 3 is a schematic diagram of the present disclosure when in use.
Figure 4:
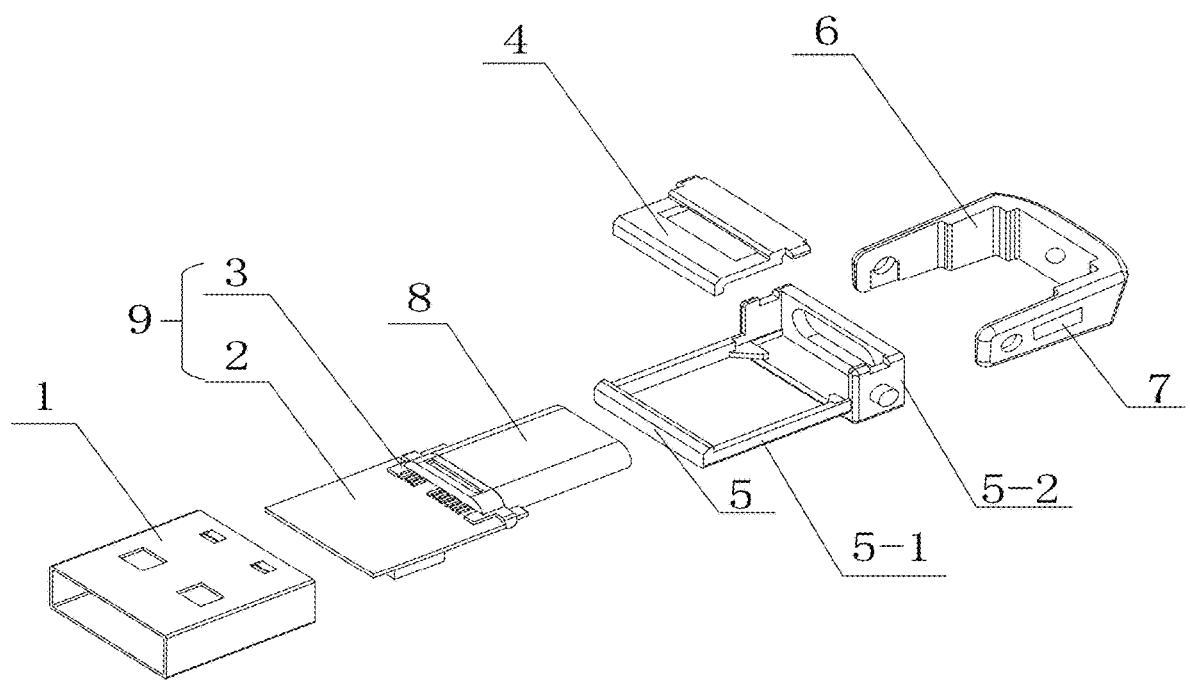
FIG. 4 is an exploded schematic diagram of the present disclosure.
Figure 5:
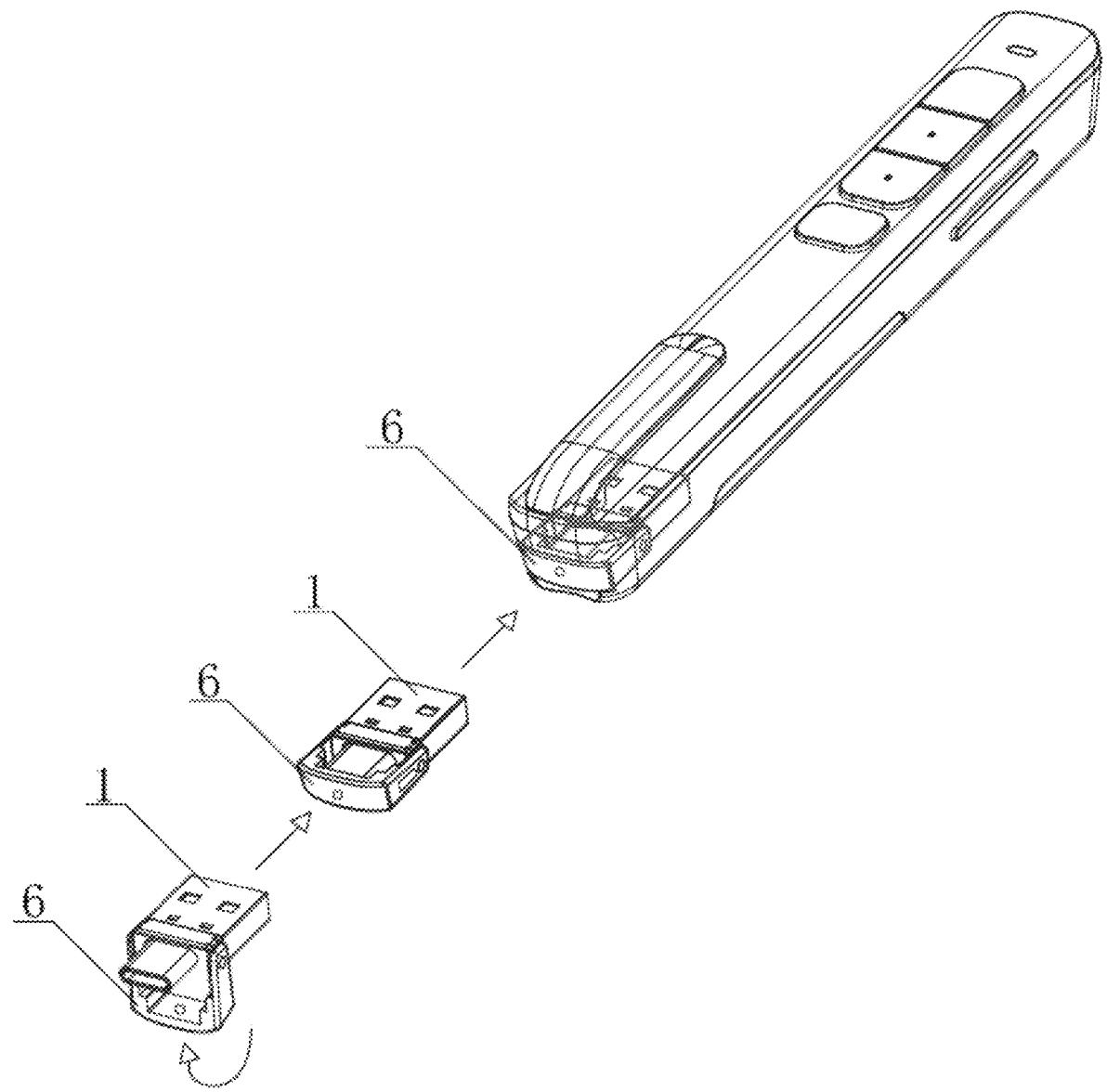
FIG. 5 is a schematic diagram of the use process of the present disclosure.
Figure 6:
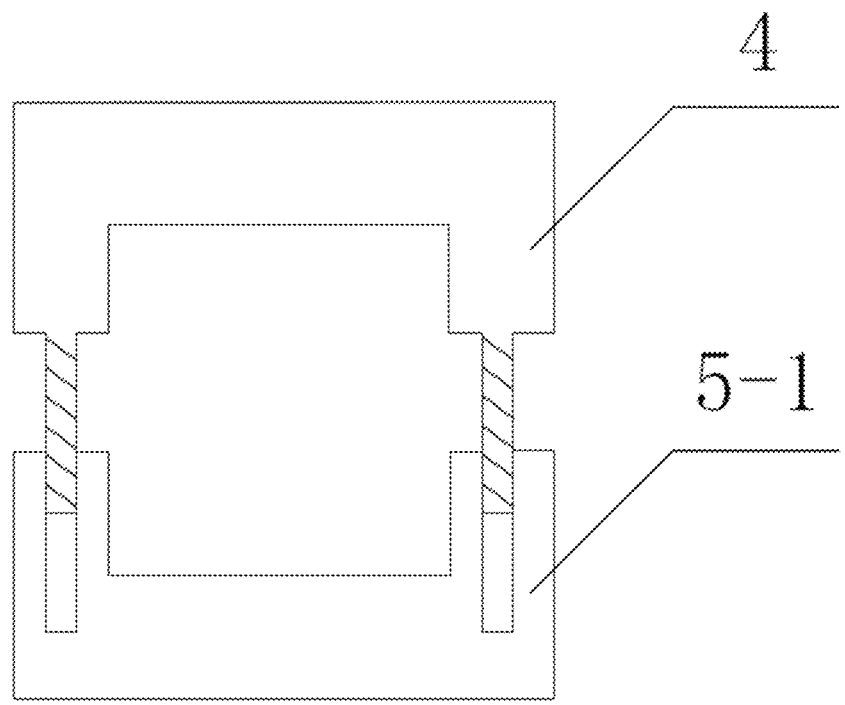
FIG. 6 is a cross-sectional view of the buckling portion being connected to the upper cover.
Figure 7:
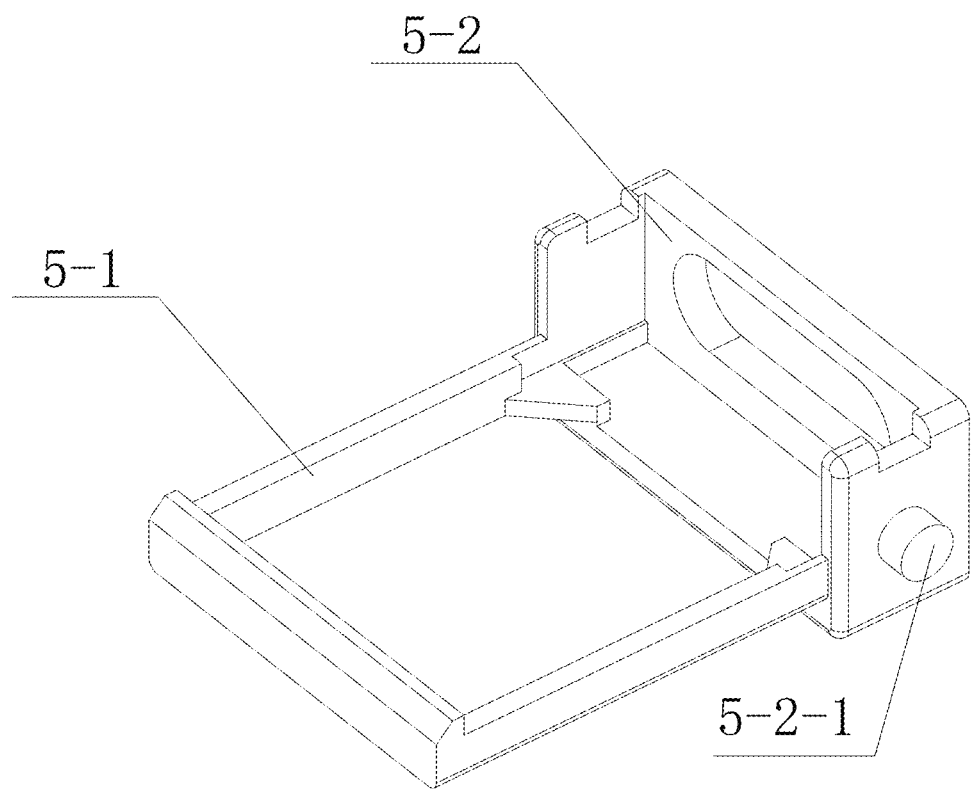
FIG. 7 is a schematic diagram illustrating the structure of the lower cover of the present disclosure.

As shown in the figures, USB interface 1, USB portion 2, Type-c portion 3, upper cover 4, lower cover 5, handle 6, connecting magnet 7, type-c interface 8, processing chip 9, buckling portion 5-1, fixing portion 5-2, fixing shaft 5-2-1, and lanyard 6-1.

DETAILED DESCRIPTION OF ILLUSTRATIVE EMBODIMENTS

The present disclosure will be explained in further detail in connection with the drawings.

Embodiment 1

The present disclosure provides a type-c and USB two-in-one interface radio frequency receiver, including a USB interface 1, a type-c interface 8, a processing chip 9, an upper cover 4, a lower cover 5, a handle 6, and a connecting magnet 7. The processing chip 9 is divided into a type-c portion 3 and a USB portion 2. The type-c portion 3 is connected to the type-c interface 8, and the type-c interface 8 is placed on the lower cover 5. The lower cover 5 includes a buckling portion 5-1 and a fixing portion 5-2, and the type-c interface 8 is placed on the buckling portion 5-1. The upper cover 4 is fixed to the upper side of the buckling portion 5-1. The type-c interface 8 passes through the fixed portion 5-2. The USB port 1 is fixed to type-c port 8 by welding. The fixing portion 5-2 is welded with fixing shafts 5-2-1 on both sides, and the fixing portion 5-2 is connected with the handle 6 through the fixing shafts 5-2-1. The connecting magnets 7 are fixed to both sides of the handle 6. The processing chip 9 includes a carrier, a type-c communication circuit, and a USB communication circuit. The type-c communication circuit and the USB communication circuit are each soldered on the carrier, and two ends of the carrier are respectively connected to the USB interface 1 and the type-c interface 8. The fixing shafts 5-2-1 are movably connected to the handle 6. The buckling portion 5-1 is of a groove structure, where the three sides of the buckling portion 5-1 form a groove structure on the upper side. The upper cover 4 is of a groove structure. The upper three portions of the upper cover 4 have a convex structure, and the groove structure and the convex structure are used in cooperation and are fitted together. The handle 6 is a rotatable structure relative to the lower cover 5. A fixing hole is defined in the upper side of the handle 6, and a lanyard 6-1 is tied in the fixing hole.

Embodiment 2

When in use, the handle 6 of the present disclosure is rotated so that the handle 6 is in the state of protecting the Type-c interface 8, and then the present disclosure is inserted into the USB socket of the laser pointer through the USB interface. When the present disclosure is inserted, the connecting magnets 7 on the handle 6 are attracted with the USB socket. When data transmission is needed, take out the present invention, and then select the interface according to the interface through which copy is needed. If the required interface is a USB interface, then use the USB interface 1 of the present disclosure to insert the USB interface to copy the data. After the data is copied, insert the present disclosure into the laser pointer. When the interface that needs to copy data is the Type-c interface, the data is copied through one end of the Type-c interface 8 of the present invention, and the upper cover 4 and the lower cover 5 that are buckled together are inserted into the Type-c interface to copy the data, then nest the present invention into the laser pointer after the data is copied. Finally, the data copied by the present invention is transmitted to the computer through the USB interface or the Type-c interface.

The foregoing merely portrays some illustrative embodiments of the present disclosure. It should be noted that those of ordinary skill in the art will be able to make multiple improvements and modifications without departing from the principle of this disclosure, and these improvements and modifications should all be regarded as falling in the scope of protection of this disclosure.

What is claimed is:

1. A type-c and USB two-in-one interface wireless radio frequency receiver, comprising a USB interface, a type-c interface, a processing chip, an upper cover, a lower cover, a handle, and a connecting magnet,
    wherein the processing chip comprises a type-c portion and a USB portion, wherein the type-c portion is connected to the type-c interface and is placed on the lower cover, wherein the lower cover comprises a buckling portion and a fixing portion, and the type-c interface is disposed on the buckling portion, wherein an upper side of the buckling portion is fixed to the upper cover, the type-c interface passes through the fixing portion, and the USB interface is fixed together with the type-c interface by welding, wherein a fixing shaft is welded on each of both sides of the fixing portion, and the fixing portion is connected with the handle through the fixing shafts, and a connecting magnet is fixed to two sides of the handle.

2. The type-c and USB two-in-one interface wireless radio frequency receiver as recited in claim 1, wherein the processing chip comprises a carrier, a type-c communication circuit, and a USB communication circuit,
    wherein the type-c communication circuit and the USB communication circuit are each welded on the carrier, and two ends of the carrier are respectively connected to the USB interface and the type-c interface.

3. The type-c and USB two-in-one interface radio frequency receiver as recited in claim 2, wherein the fixing shafts are connected to the handle.

4. The type-c and USB two-in-one interface radio frequency receiver as recited in claim 1, wherein the handle is a rotatable structure relative to the lower cover.

5. The type-c and USB two-in-one interface radio frequency receiver as recited in claim 1, wherein a fixing hole is defined in an upper side of the handle, and a lanyard is tied in the fixing hole.

* * * * *